(12) United States Patent
Park et al.

(10) Patent No.: US 7,473,937 B2
(45) Date of Patent: Jan. 6, 2009

(54) SIDE-EMISSION TYPE LED PACKAGE

(75) Inventors: Young Sam Park, Seoul (KR); Hyung Suk Kim, Kyungki-do (KR); Jung Kyu Park, Seoul (KR); Ho Sik Ahn, Kyungki-do (KR); Young June Jeong, Kyungki-do (KR); Hun Joo Hahm, Kyungki-do (KR); Bum Jin Kim, Kyungki-do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 0 days.

(21) Appl. No.: 11/318,837

(22) Filed: Dec. 28, 2005

(65) Prior Publication Data

US 2006/0171151 A1 Aug. 3, 2006

(30) Foreign Application Priority Data

Feb. 3, 2005 (KR) .................. 10-2005-0010046
May 26, 2005 (KR) .................. 10-2005-0044649

(51) Int. Cl.
*H01L 29/22* (2006.01)
(52) U.S. Cl. ................... 257/98; 257/E33.067
(58) Field of Classification Search ............. 257/95, 257/98, 100, 687, 730, 787, 788; 362/327, 362/608, 609, 611, 612, 800; 438/29, 25, 438/106, 116, 127, 121, 124
See application file for complete search history.

(56) References Cited

U.S. PATENT DOCUMENTS 6,679,621 B2   1/2004  West et al.
6,803,607 B1 *  10/2004  Chan et al. .................. 257/98

(Continued)

FOREIGN PATENT DOCUMENTS

DE        519 132        2/1931

(Continued)

OTHER PUBLICATIONS

German Patent Office, Office Action mailed Jul. 4, 2006 and English Translation.
Korean Intellectual Property Office, Office Action, mailed May 25, 2006.

*Primary Examiner*—Zandra V. Smith
*Assistant Examiner*—Paul E Patton
(74) *Attorney, Agent, or Firm*—Lowe Hauptman Ham & Berner

(57) ABSTRACT

A side-emission type LED package is provided. The LED package includes an LED chip, a lower structure, and an upper structure. The lower structure has a lower mirror and a transparent sealing member. The lower structure supports the LED chip. The lower mirror is extended upward and outward@ from the LED chip so as to reflect light from the LED chip upward. The transparent sealing member is formed around the LED chip inside the lower mirror. The upper structure is combined to an upper portion of the lower structure so as to reflect the light reflected upward by the lower structure to a radial lateral direction. As described above, the lower structure and the upper structure are separately provided and combined with each other, whereby molding efficiency of the sealing member is improved and the side-emission type LED package can be manufactured in an easy manner.

8 Claims, 18 Drawing Sheets

U.S. PATENT DOCUMENTS

| | | | |
|---|---|---|---|
| 6,932,496 B2 * | 8/2005 | Rizkin et al. | 362/299 |
| 6,946,714 B2 * | 9/2005 | Waitl et al. | 257/434 |
| 6,981,792 B2 * | 1/2006 | Nagakubo et al. | 362/600 |
| 7,118,262 B2 * | 10/2006 | Negley | 362/555 |
| 7,157,745 B2 * | 1/2007 | Blonder et al. | 257/98 |
| 2006/0077692 A1 * | 4/2006 | Noh et al. | 362/625 |

FOREIGN PATENT DOCUMENTS

| | | |
|---|---|---|
| DE | 297 08 858 | 9/1997 |
| DE | 202 06 201 | 9/2002 |
| EP | 0 400 176 | 12/1990 |
| JP | 2001-185762 | 7/2001 |
| WO | 03/048637 | 6/2003 |
| WO | WO 03/048637 A1 * | 6/2003 |
| WO | 2006/023048 | 3/2006 |

* cited by examiner

SIDE-EMISSION TYPE LED PACKAGE

RELATED APPLICATION

The present application is based on, and claims priority from, Korean Application Numbers 10-2005-0010046, filed Feb. 3, 2005, and 10-2005-0044649, filed May 26, 2005, the disclosure of which is hereby incorporated by reference herein in its entirety.

BACKGROUND OF THE INVENTION

1. Field of the Invention

The present invention relates to a side-emission type light-emitting diode (LED) package, and more particularly, to a side-emission type LED package capable of improving molding efficiency of a sealing member by separately providing a lower structure for reflecting light upward from an LED chip and an upper structure for reflecting the light in a lateral direction and then combining the lower and the upper structures.

2. Description of the Related Art

As the electronic apparatus industry develops, a liquid crystal display (LCD) is drawing attention as a next-generation display device. Since the LCD does not emit light spontaneously, the LCD has a backlight module for providing light on its backside panel.

FIG. 1 is a cross-sectional view illustrating an example of a side-emission type LED lens of a related art for use in an LCD backlight module. FIG. 1 illustrates a cross-section of an LED lens disclosed in U.S. Pat. No. 6,679,621 as an example of the side-emission type LED lens of the related art.

As illustrated in FIG. 1, an LED lens 10 disclosed in the above United States patent includes an upper portion having a reflecting surface I and a refracting surface H and a lower portion having another refracting surface 156. Further, the LED lens 10 is symmetric about an optical axis 43 when seen from a three-dimensional viewpoint.

In the LED lens, light emitted from a focus F is reflected from the reflecting surface I before being emitted to the outside through the refracting surface H, or directly emitted to the outside through the refracting surface 156.

However, the related art LED lens 10 has the following problems.

First, the LED lens 10 is difficult to manufacture. That is, it is difficult to precisely forming a connection portion L of the refracting surface H and the lower refracting surface 156 and an inner cusp P of the reflecting surface I through a forming process, and a strip might be produced on the connection portion L or on a lens' surface in the neighborhood thereof when forming the LED lens.

Further, an additional process for preventing bubbles is required when a resin is filled into a cavity C for receiving the LED chip denoted by a focus F. That is, the LED chip is mounted on a substrate (not shown), the LED lens 10 is combined with the substrate so that the LED chip may be positioned in the space C of the LED lens 10, and a transparent resin is injected into the cavity C. However, according to the above-described process, there is a possibility that bubbles might be produced, for the resin is not completely filled into the cavity C. Therefore, an additional process of removing the bubbles through an air outlet is required. However, there still exists possibility that the bubbles might remain despite the additional process, which might deteriorate optical characteristics of the LED package.

SUMMARY OF THE INVENTION

Accordingly, the present invention is directed to a side-emission type LED package that substantially obviates one or more problems due to limitations and disadvantages of the related art.

An object of the present invention is to provide a side-emission type LED package capable of improving molding efficiency of a sealing member and thus improving manufacturing efficiency by separately providing a lower structure for reflecting light upward from an LED chip and an upper structure for reflecting the light in a lateral direction and combining the lower and the upper structures.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an LED package, which includes: an LED chip; a lower structure having a lower mirror extended upward and outward from the LED chip, for reflecting light upward from the LED chip while supporting the LED chip and a transparent sealing member formed around the LED chip in the lower mirror; and an upper structure combined to an upper portion of the lower structure, for reflecting the light reflected upward by the lower structure to a radial lateral direction.

In the LED package, the upper structure has: a reflection part having a reflecting surface slant with respect to an axial line, for reflecting the light reflected by the lower structure in a lateral direction; and a support combined to an upper portion of the lower structure, for supporting the reflection part.

In the LED package, the upper structure comprises a transparent member having a reflecting surface slant about an axial line, for reflecting the light from a lower portion in a lateral direction and a discharging surface for discharging the light reflected by the reflecting surface to an outside.

According to an aspect of the present invention, there is provided an LED package, which includes: an LED chip; a lower structure having a lower mirror so extended upward and outward from the LED chip as to reflect light upward from the LED chip while supporting the LED chip and a transparent sealing member filled around the LED chip within the lower mirror; and an upper structure having a reflection part including a reflecting surface slant about an axial line so as to reflect the light reflected by the lower structure to a radial lateral direction and a plurality of pins combined to an upper portion of the transparent sealing member so as to support the reflection part.

According to another aspect of the present invention, there is provided an LED package, which includes: an LED chip; a lower structure having a lower mirror so extended upward and outward from the LED chip as to reflect light upward from the LED chip while supporting the LED chip, a transparent sealing member filled around the LED chip within the lower mirror, and a holder formed around an outer periphery of the lower mirror; and an upper structure having a reflection part including a reflecting surface slant about an axial line so as to reflect the light reflected by the lower structure to a radial lateral direction and a plurality of pins combined to the holder so as to support the reflection part.

According to yet another aspect of the present invention, there is provided an LED package, which includes: an LED chip; a lower structure having a lower mirror so extended upward and outward from the LED chip as to reflect light upward from the LED chip while supporting the LED chip and a transparent sealing member filled around the LED chip within the lower mirror; and a transparent upper structure having a reflecting surface slant about an axial line so as to reflect the light reflected by the lower structure to a radial lateral direction and a discharging surface for discharging the light reflected by the reflecting surface to the outside, and having its backside combined to an upper surface of a resin.

According to still another aspect of the present invention, there is provided an LED package, which includes: an LED chip; a lower structure having a lower mirror so extended upward and outward from the LED chip as to reflect light upward from the LED chip while supporting the LED chip and an upper-hemisphere-shaped transparent sealing member formed around the LED chip in the lower mirror; and a transparent upper structure having a reflecting surface slant about an axial line so as to reflect the light reflected by the lower structure to a radial lateral direction and a discharging surface for discharging the light reflected by the reflecting surface to the outside, and combined to an upper edge of the lower structure.

In the LED package, the upper structure is made of metal or polymer of a high reflectivity.

In the LED package, the lower mirror is made of metal or polymer of a high reflectivity.

It is to be understood that both the foregoing general description and the following detailed description of the present invention are exemplary and explanatory and are intended to provide further explanation of the invention as claimed.

According to still another aspect of the present invention, there is provided an LED assembly comprising: an LED chip; a lower structure sealing the LED chip, and configured to radiate light upward from the LED chip; a substrate for seating the lower structure; and an upper structure supported on the substrate to reflect light, which is radiated upward by the lower structure, radially in a lateral direction.

In the LED assembly, the upper structure may comprise: a reflection part having a reflecting surface slant with respect to an axial line, for reflecting the light reflected by the lower structure in a lateral direction; and a support combined to an upper portion of the lower structure, for supporting the reflection part.

In this case, the support may comprise a plurality of pins combined to an upper portion of the transparent sealing member. Preferably, the pins are fixed to the substrate by at least one of interference fit, bonding and soldering. Also, the LED assembly may further comprise holders fixed to the substrate to receive the pins, in number corresponding to the pins.

In the LED assembly, the upper structure is preferably spaced from the lower structure at a predetermined distance.

In the LED assembly, the upper structure is preferably made of metal or high reflectivity molding.

In the LED assembly, the lower structure may comprise: a lower mirror supporting the LED chip, the lower mirror extended upward from and around the LED chip to reflect light upward from the LED chip; and a transparent sealing part provided surrounding the LED chip inside the lower mirror.

In the LED assembly, the lower structure may comprise: a mount supporting the LED chip; and a transparent sealing part disposed on the mount to seal the LED chip.

Also in the LED assembly, the substrate is preferably a reflector plate of a backlight unit in which the LED assembly is installed.

According to yet another aspect of the present invention, there is provided an LED assembly comprising: an LED chip; a lower structure sealing the LED chip, and configured to radiate light upward from the LED chip; a substrate for seating the lower structure; a transparent plate arranged on the substrate, spaced from the lower structure at a predetermined distance; and an upper structure arranged on an underside of the transparent plate to reflect light, which is radiated upward by the lower structure, radially in lateral direction.

In the LED assembly, the upper structure preferably has a reflecting surface inclined about a central axis to reflect light, which is reflected by the lower structure, in a lateral direction, and a flat top surface attached to the underside of the transparent plate.

In the LED assembly, the upper structure is preferably adhered to the underside of the transparent plate, or injection-molded on the underside of the transparent plate. Besides, the upper structure is preferably made of high reflectivity molding or metal.

In the LED assembly, is preferably spaced from the lower structure at a predetermined distance.

In the LED assembly, the lower structure may comprise: a lower mirror supporting the LED chip, the lower mirror extended upward from and around the LED chip to reflect light upward from the LED chip; and a transparent sealing part provided surrounding the LED chip inside the lower mirror.

In the LED assembly, the lower structure may comprise: a mount supporting the LED chip; and a transparent sealing part disposed on the mount to seal the LED chip.

In the LED assembly, the substrate is preferably a reflector plate of a backlight unit in which the LED assembly is installed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
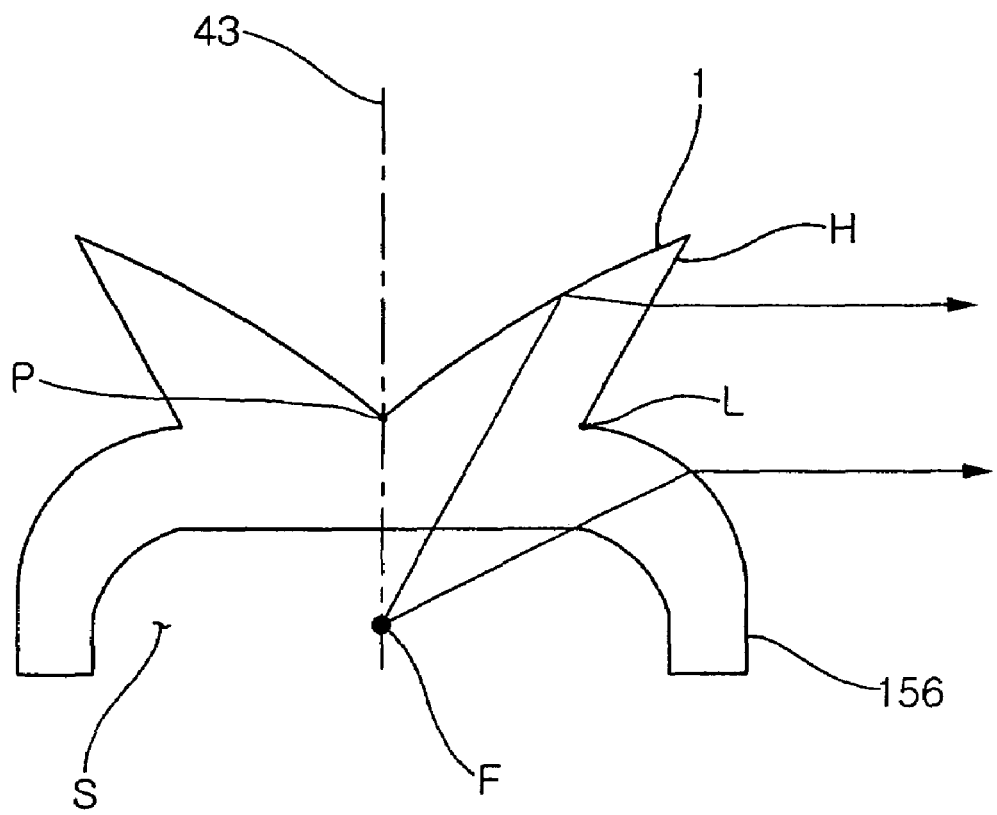
FIG. 1 is a cross-sectional view of an LED lens of a related art.

Reference will now be made in detail to the preferred embodiments of the present invention, examples of which are illustrated in conjunction with the accompanying drawings.

First, referring to FIGS. 2 to 4, an LED package according to the first embodiment of the present invention will be described. In the drawings, FIG. 2 is an exploded, perspective view of an LED package according to the first embodiment of the present invention, FIG. 3 is a perspective view illustrating a combined state of the LED package according to the first embodiment, FIG. 4 is a cross-sectional view taken along line IV-IV of FIG. 3, and FIG. 5 is a schematic, cross-sectional view illustrating an operation of the LED package according to the first embodiment of the present invention.

Figure 2:
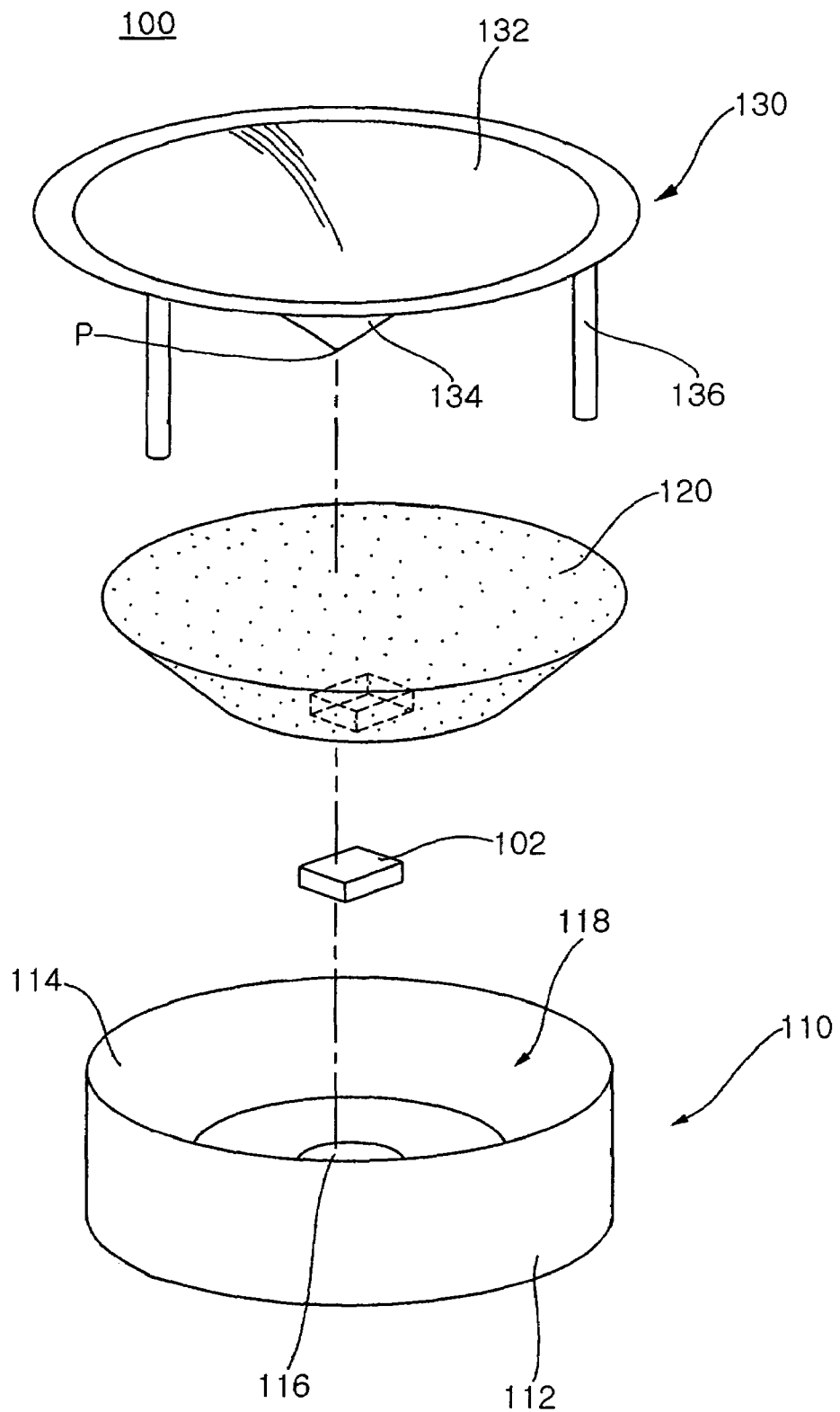
FIG. 2 is an exploded, perspective view of an LED package according to the first embodiment of the present invention.
Figure 3:
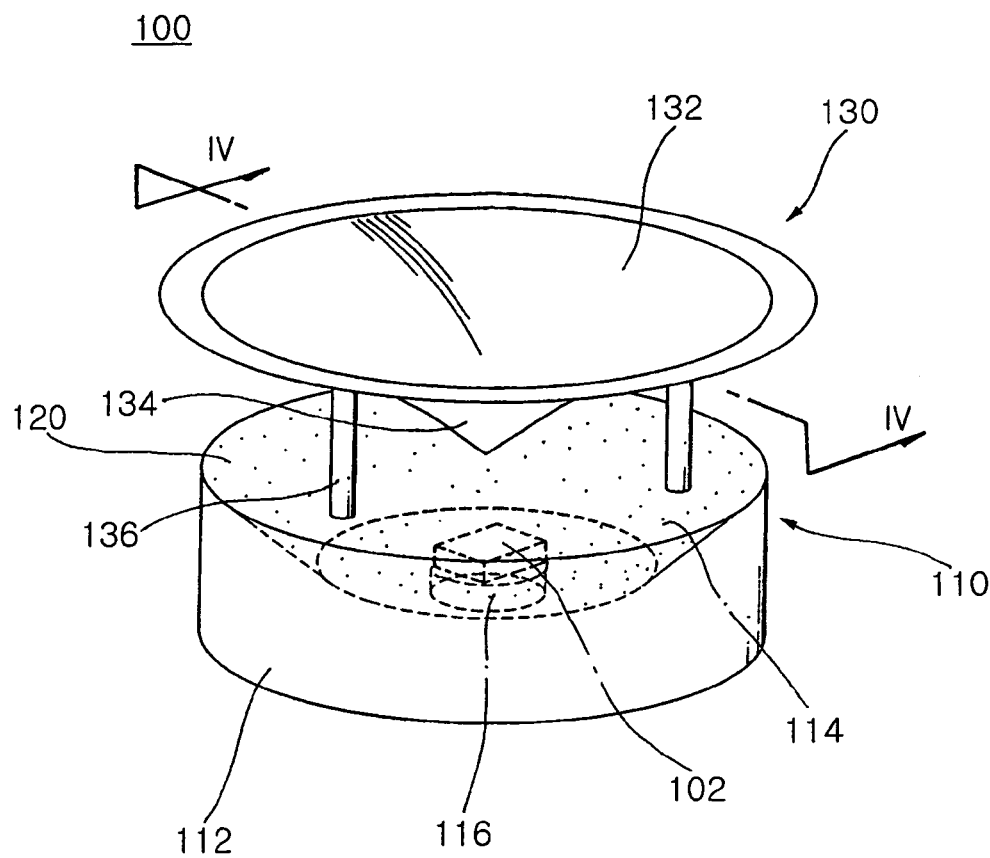
FIG. 3 is a perspective view illustrating a combined state of the LED package of FIG. 2.
Figure 4:
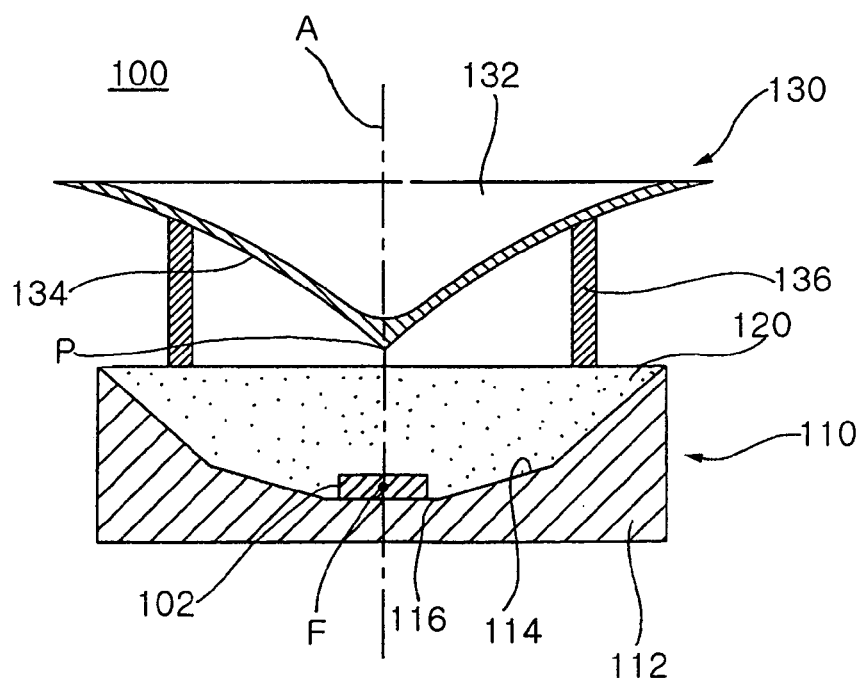
FIG. 4 is a cross-sectional view taken along line IV-IV of FIG. 3.

Referring to FIGS. 2 to 4, the LED package 100 of the present invention includes: an LED chip 102; a lower structure 110 for reflecting light upward from the LED chip while supporting the LED chip; and an upper structure 130 combined to an upper portion of the lower structure 110, for reflecting the light reflected upward by the lower structure 110 to a radial lateral direction.

The lower structure 110 includes a main body 112 and a mount 116 inside the main body 112, supporting the LED chip 102 as a bottom. The main body 112 is concaved in its inside to form a concaved cavity C and has a lower mirror 114 on its surface. Further, the cavity C has the mount 114 disposed on its bottom so as to support the LED chip 102. A sealing member 120 is filled into the surrounding of the LED chip 102 so that the LED chip 102 may be sealed from the outside.

Figure 5:
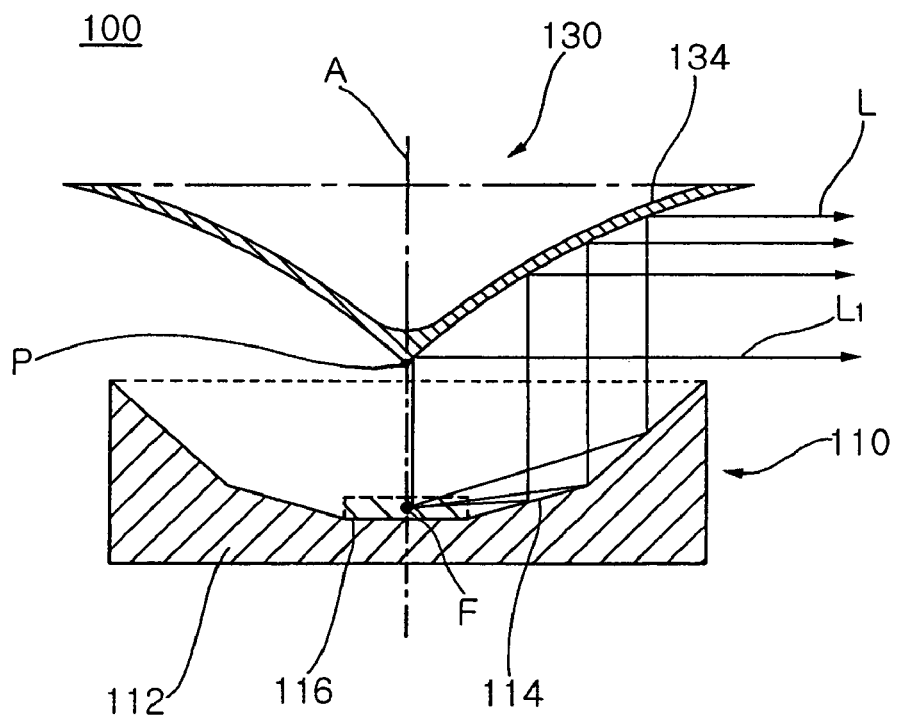
FIG. 5 is a schematic, cross-sectional view illustrating an operation of the LED package of FIG. 2.

The lower mirror 114 is extended upward and outward from the LED chip 102 so as to reflect the light upward from the LED chip 102 as illustrated in FIG. 5. The lower mirror 114 includes a plurality of planes connected with one another as illustrated. In other configurations, the lower mirror 114 can include a single curved plane or a plurality of curved planes so formed as to reflect the light from the LED chip 102 upward and toward the upper structure 130.

The main body 112 of the lower structure 110 can be formed using casting, cutting, molding and can be manufactured integrally with the lower mirror 114 using metal or polymer. In that case, the main body 112 and the lower mirror 114 of the lower structure 110 are formed using metal of a high reflectivity or polymer of a high reflectivity.

For a polymer of a high reflectivity, NM114WA and NM04WA, which are product names of Otsuka Chemical Co., Ltd. can be used. Since the above-mentioned material shows a high reflectivity under a high temperature of about 180° C., it is appropriate as material for the main body 112 and/or the lower mirror 114 of the lower structure. Specifically, NM114WA has an initial reflectivity of 88.3% and maintains a reflectivity of 78.0% after two hours for a wavelength of 470 nm. NM04WA has an initial reflectivity of 89.0% and maintains a reflectivity of 89.0% after two hours for a wavelength of 470 nm.

Unlike this configuration, the main body 112 can be made of metal or polymer of a low reflectivity and the lower mirror 114 can be prepared in form of a film of a high reflectivity. This film can be realized using metal of a high reflectivity or the above-described polymer of a high reflectivity.

Figure 4A:
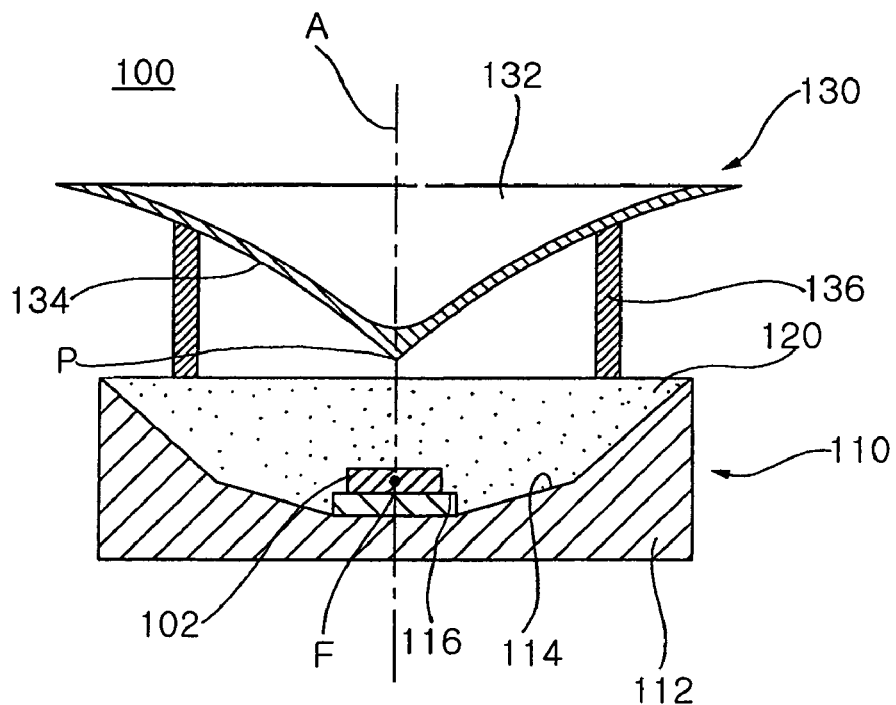
FIG. 4A is a cross-sectional view of an LED package corresponding to FIG. 4, which adopts a sub-mount.

The mount 116 is made flat and the LED chip 102 is mounted thereon. Of course, referring to FIG. 4A, a sub-mount 106 can be mounted on the mount 116 with the LED chip 102 attached to the sub-mount 106.

A sealing member 120 is made of a transparent resin. For the sealing member, a resin having a thermal expansion rate and a refractive index similar to the LED chip 102 may be selected. Particularly, silicone not only has excellent optical characteristic due to large refractive index and excellent resistance against yellowing, that is, change in quality caused by single wavelength light but also maintains jell or elastomer state even after hardening, and thus can stably protect the LED chip 102 from impulses and vibrations.

The upper structure 130 includes a funnel-shaped main body 132 and three pins 136 (only two of them are shown) joined to an upper portion of the sealing member 120, for supporting the upper structure 130. The upper structure 130 is of a tripod shape on the whole. Further, the main body 132 of the upper structure 130 has an upper mirror 134 on its lower surface. The upper mirror 134 can have a variety of shapes such as a conical shape and a somewhat swollen conical shape besides the funnel shape as shown.

The upper mirror 134 is configured to reflect light L, which is generated from the LED chip 102 and reflected upward by the lower mirror 114, in a lateral direction. In addition, the upper mirror 134 reflects light L1 directly reached to the upper portion from the LED chip 102 to the lateral direction.

In the meantime, the upper mirror 134 is arranged so that its axial line A that includes a vertex P may be aligned with a focus F of the LED chip 102. Here, the focus F means a point positioned at a center of the LED chip 102, which is a light-emitting source.

At this point, the main body 132 of the upper structure 130 can be formed using casing, cutting, and molding, and can be manufactured integrally with the upper mirror 134 using metal or polymer. In that case, the main body 132 and the upper mirror 134 of the lower structure 110 are formed using metal of a high reflectivity or polymer of a high reflectivity.

Unlike this configuration, the main body 132 of the upper structure can be made of metal or polymer of a low reflectivity and the upper mirror 134 can be prepared in form of a film of a high reflectivity. This film can be realized using metal of a high reflectivity or the above-described polymer of a high reflectivity. Further, for injection material having an excellent reflectivity, there exists material containing $TiO_2$.

The pins 136 are adhered to or inserted into the sealing member 120 to combine the upper structure 130 to the lower structure 110, and have such a diameter that does not have an influence on the light L reflected to the lateral direction by the upper mirror 134, preferably a diameter of less than 0.4 mm.

In a manufacturing process, the lower structure 110 is manufactured first, the LED chip 102 is mounted on the mount 116, and a transparent resin is poured down so that the sealing member 120 is formed. After that, the upper structure 130 is combined to the sealing member 120, so that the LED package 100 is completed.

At this point, though not shown, the pins 136 may be inserted, in a predetermined depth, into the sealing member 120 before the sealing member 120 is completely hardened. By doing this, the hardened sealing member 120 is firmly adhered to the pins 136 and thus the upper structure 130 is naturally combined to the lower structure 110.

As described above, the transparent resin is poured down from upward into the cavity C of the lower structure 110 on which the LED chip 102 is mounted and thus forming process for the sealing member 120 gets easy. Further, even if bubbles are produced in the resin of the sealing member 120, they are evaporated during cooling process and thus the disadvantage of the related art that produces the bubbles is improved.

Figure 6:
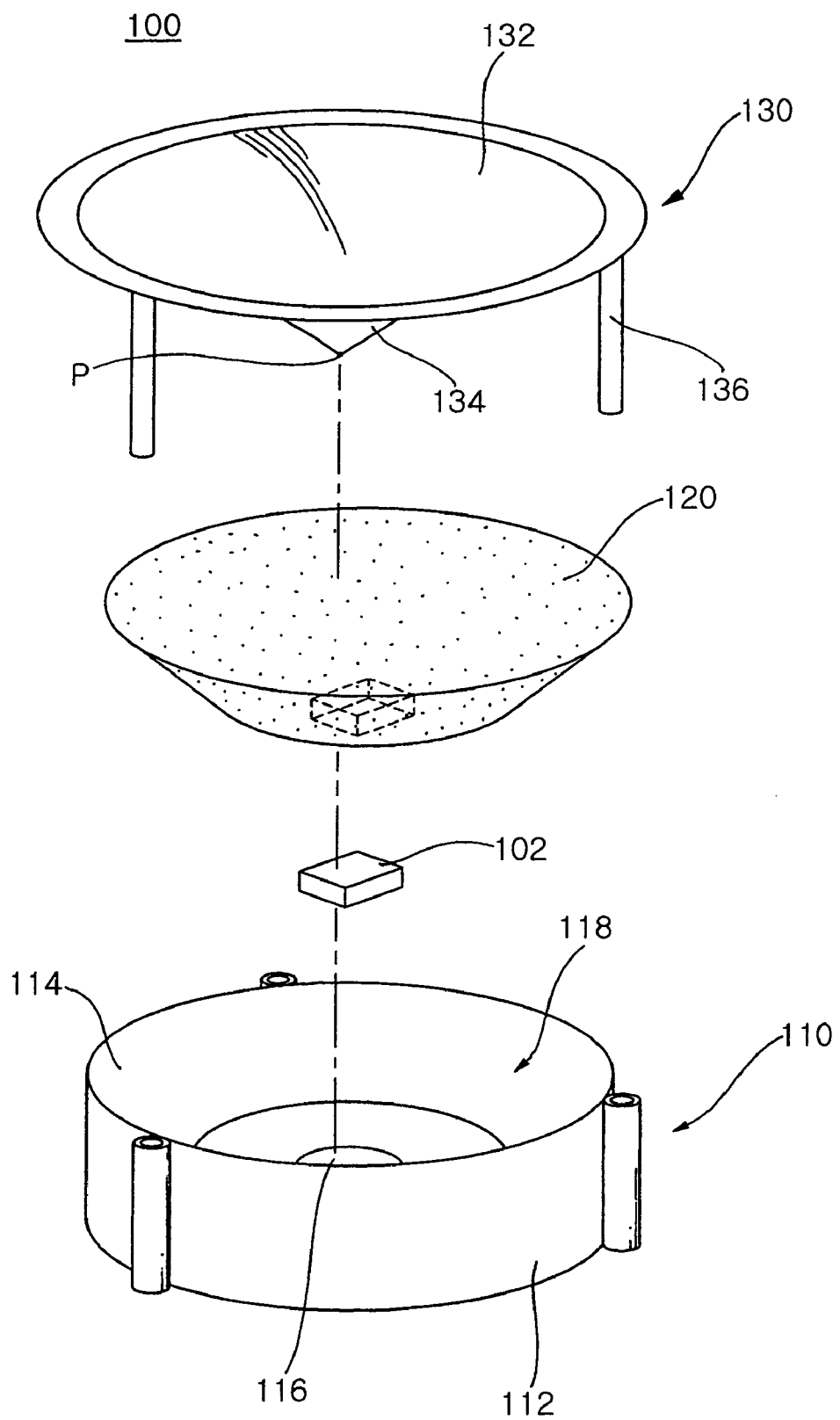
FIG. 6 is an exploded, perspective view of an LED package according to the second embodiment of the present invention.

FIG. 6 is an exploded, perspective view illustrating a modification of an LED package according to the second embodiment of the present invention. Referring to FIG. 6, an LED package 200 is substantially the same as the LED package 100 of the above-described first embodiment except that holders 218 are formed on an outer periphery of a lower structure 212 and pins 236 of an upper structure 230 are formed in response to these holders 128. Therefore, the same reference numerals starting with 200 are given to the corresponding elements and descriptions thereof are omitted.

If the holders 218 for receiving the pins 236 are formed on the lower structure 210 and the pins 236 are inserted into the holders 218 when the upper structure 230 is combined to the lower structure 210, the combining process gets easier and the manufacturing process gets simple even more.

Figure 7:
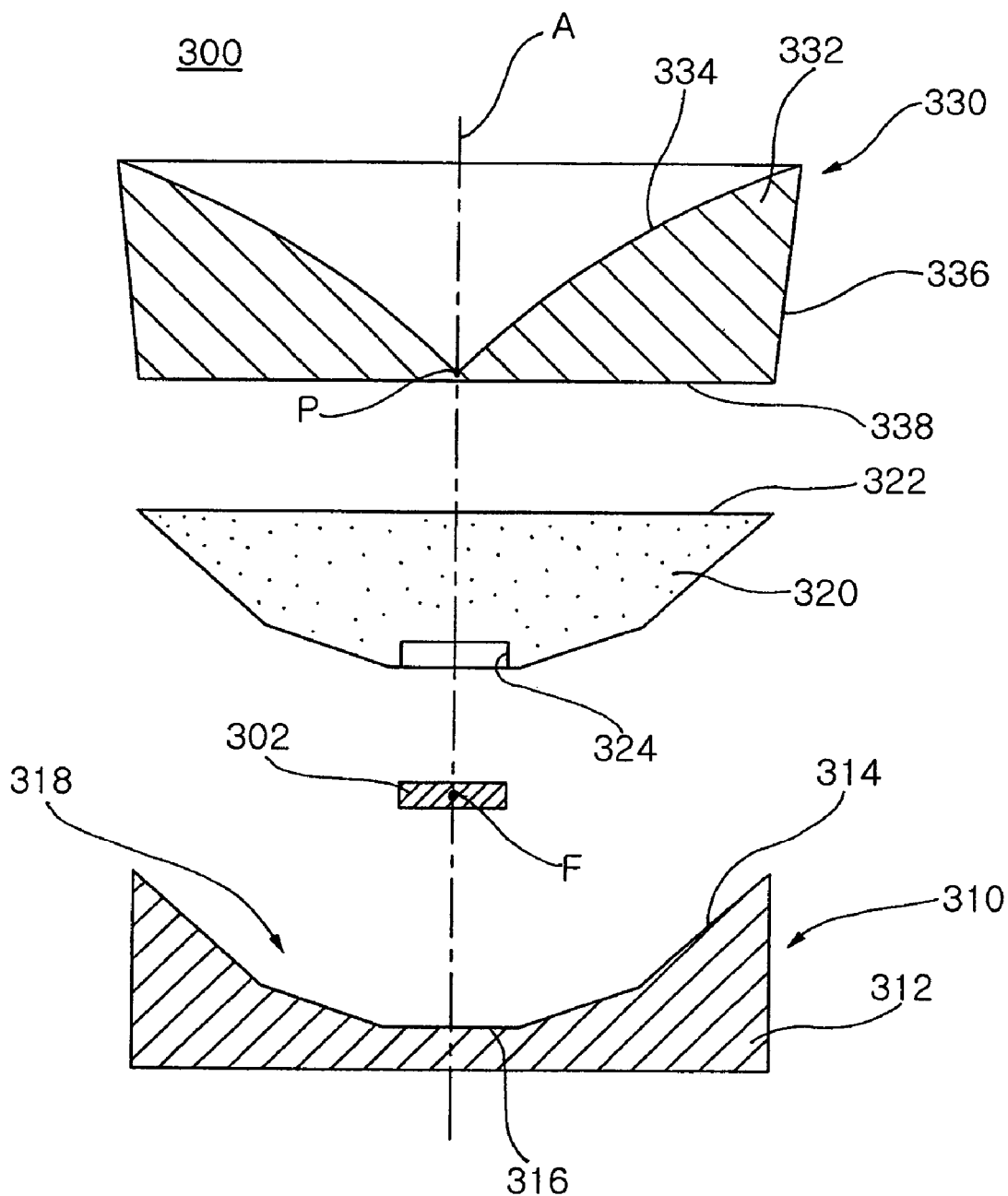
FIG. 7 is a cross-sectional view of an LED package according to the third embodiment of the present invention.
Figure 8:
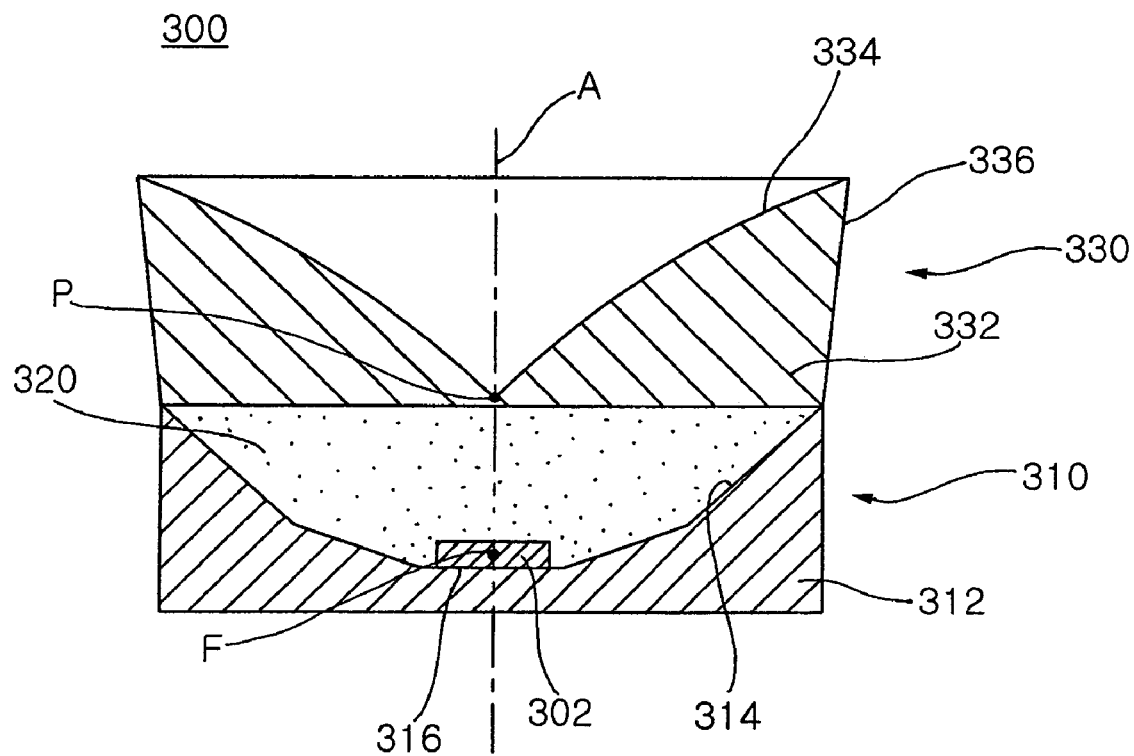
FIG. 8 is a perspective view illustrating a combined state of the LED package of FIG. 7.
Figure 9:
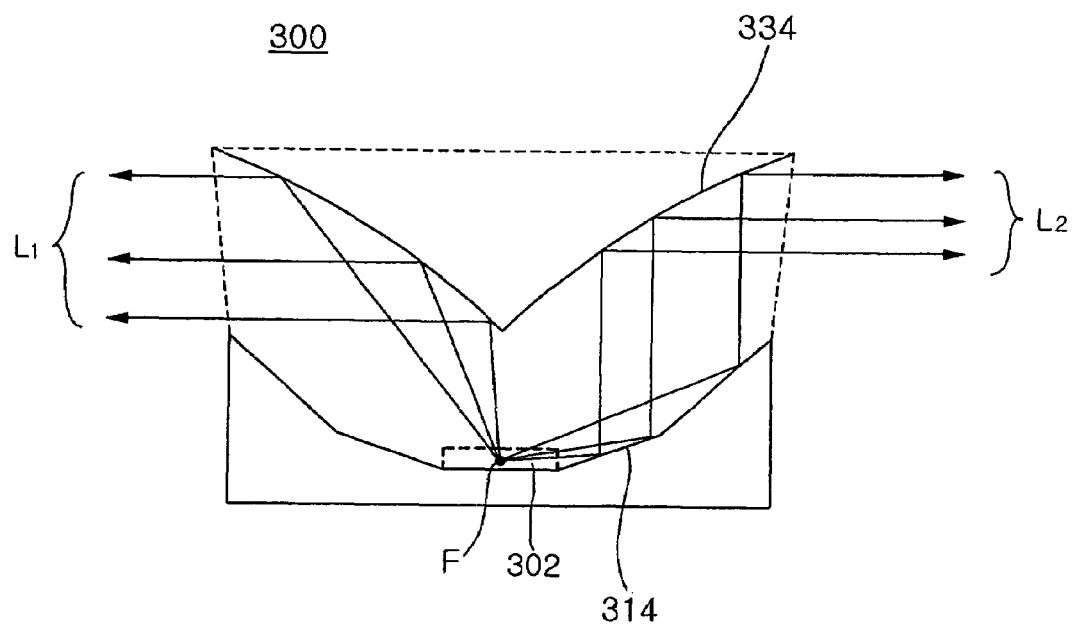
FIG. 9 is a schematic, cross-sectional view illustrating an operation of the LED package of FIG. 7.

FIG. 7 is a cross-sectional view of an LED package according to the third embodiment of the present invention, FIG. 8 is a perspective view illustrating a combined state of the LED package of FIG. 7, and FIG. 9 is a view illustrating an operation of the LED package according to the second embodiment of the present invention.

Referring to FIGS. 7 and 8, an LED package 300 includes: an LED chip 302; a lower structure 310 for supporting the LED chip 302 while reflecting light upward from the LED chip 302; and an upper structure 330 combined to an upper portion of the lower structure 310, for reflecting the light reflected upward by the lower structure 310 to a radial lateral direction.

The lower structure 310 includes a main body 312 and a flat mount 316 for supporting the LED chip 302 inside the main body 312.

The main body 312 is concaved in its inside to form a concaved cavity C and has a lower mirror 314 on its surface. Further, a sealing member 320 is filled into the surrounding of the LED chip 302 in the cavity C so that the LED chip 302 may be sealed from the outside.

The lower mirror 314 is extended upward and outward from the LED chip 302 and so configured as to reflect upward the light from the LED chip 302 as illustrated in FIG. 9. The lower mirror 314 includes a plurality of planes connected with one another as illustrated. In other configurations, the lower mirror 314 can include a single curved plane or a plurality of curved planes so formed as to reflect the light from the LED chip 302 upward and toward the upper structure 330.

The main body 312 of the lower structure 310 can be processed using casting or cutting, and can be manufactured integrally with the lower mirror 314 using metal or polymer. In other configuration, the main body 312 of the lower structure 310 can be formed using a polymer and the lower mirror 314 can be prepared in form of a metal layer.

The main body 312 of the lower structure 310 can be processed using casting or cutting, and can be manufactured integrally with the lower mirror 314 using metal or polymer. In case of forming the main body 312 of the lower structure 310 integrally with the lower mirror 314, these elements may be formed using metal of a high reflectivity or polymer of a high reflectivity.

For a polymer of a high reflectivity, NM114WA and NM04WA, which are product names of Otsuka Chemical Co., Ltd. can be used. Since the above-mentioned material shows a high reflectivity under a high temperature of about 180° C., it is appropriate as material for the main body 112 and/or the lower mirror 114 of the lower structure. Specifically, NM114WA has an initial reflectivity of 88.3% and maintains a reflectivity of 78.0% after two hours for a wavelength of 470 nm. NM04WA has an initial reflectivity of 89.0% and maintains a reflectivity of 89.0% after two hours for a wavelength of 470 nm.

Unlike this configuration, the main body 312 can be made of metal or polymer of a low reflectivity and the lower mirror 314 can be prepared in form of a film of a high reflectivity. This film can be realized using metal of a high reflectivity or the above-described polymer of a high reflectivity.

A sealing member 320 is made of a transparent resin. For the sealing member, a resin having a thermal expansion rate and a refractive index similar to the LED chip 302 may be selected. Particularly, silicone not only has excellent optical characteristic since it shows very little change due to light of a single wavelength such as yellowing and has a large refractive index but also maintains jell or elastomer state even after hardening process and thus can stably protect the LED chip 302 from impulses and vibrations.

The hardened sealing member 320 has a flat upper surface and a chip-receiving portion 324 formed around the LED chip 302 at its lower portion.

The upper structure 330 is an integral-type member obtained by molding the transparent resin, and is of a structure into which the main body 332 is filled. The main body 332 has, on its upper portion, a reflecting surface 334 for reflecting light L1 and L2 coming from the lower portion in a lateral direction, and on its side, a discharging surface 336 for discharging the light L1 and L2 reflected by the reflecting surface 334 to the outside.

The reflecting surface 334 may have a shape linearly symmetric about an axial line A passing through an inner cusp P and a focus F of the LED chip 302. Therefore, the light L1 and L2 incident to the reflecting surface 334 is reflected to a radial direction.

At this point, the upper structure 330 has a flat bottom 338, and thus comes into close plane-contact with an upper surface 322 of the sealing member 320 when combined to the lower structure 310.

Therefore, if the upper structure 330 is molded using material having the same refractive index as the sealing body 320, the light L1 and L2 from the focus of the LED chip can propagate from the sealing member 320 into the upper structure 330 without refraction or reflection as illustrated in FIG. 9.

In a manufacturing process, the lower structure 310 is manufactured first, the LED chip 302 is mounted on the mount on the bottom of the lower structure 310, and a transparent resin is poured down so that the sealing member 320 is formed. After that, the uppers structure 330 is combined to the sealing member 320, so that the LED package 300 is completed.

At this point, the upper structure 330 can be formed separately in advance, the upper surface 322 of the sealing member 320 and the bottom 338 of the upper structure 330 are put together to contact each other, and pressure is applied to them before the sealing member 320 is hardened so that these elements can be bonded with each other.

By doing this, the transparent resin is poured down from upward into the cavity C of the lower structure 310 on which the LED chip 302 is mounted, and thus forming process for the sealing member 320 gets easy. Further, even if bubbles are produced in the resin of the sealing member 320, they are evaporated during cooling process and thus the disadvantage of the related art that produces the bubbles is improved.

Figure 10:
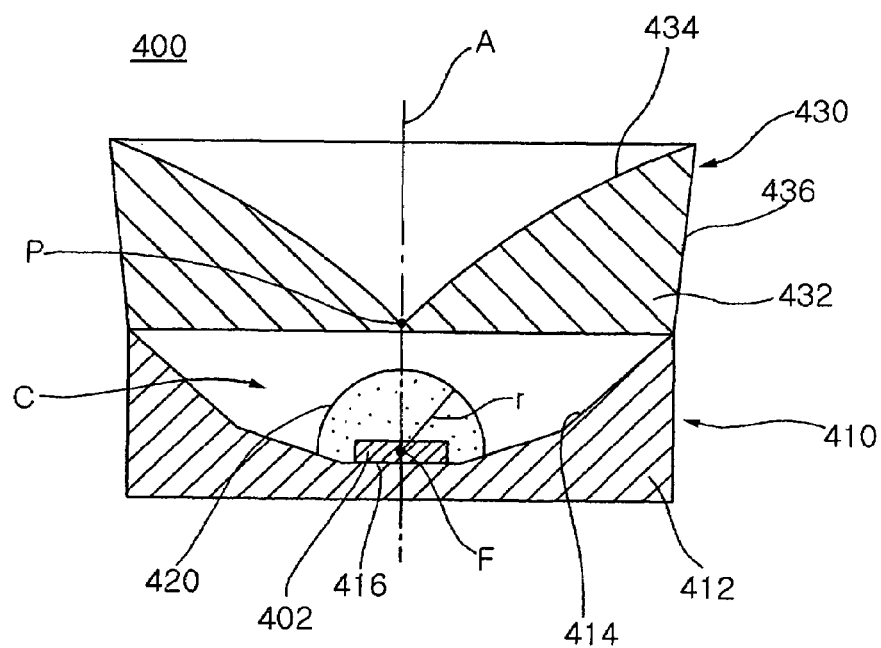
FIG. 10 is a cross-sectional view of an LED package according to the fourth embodiment of the present invention.
Figure 11:
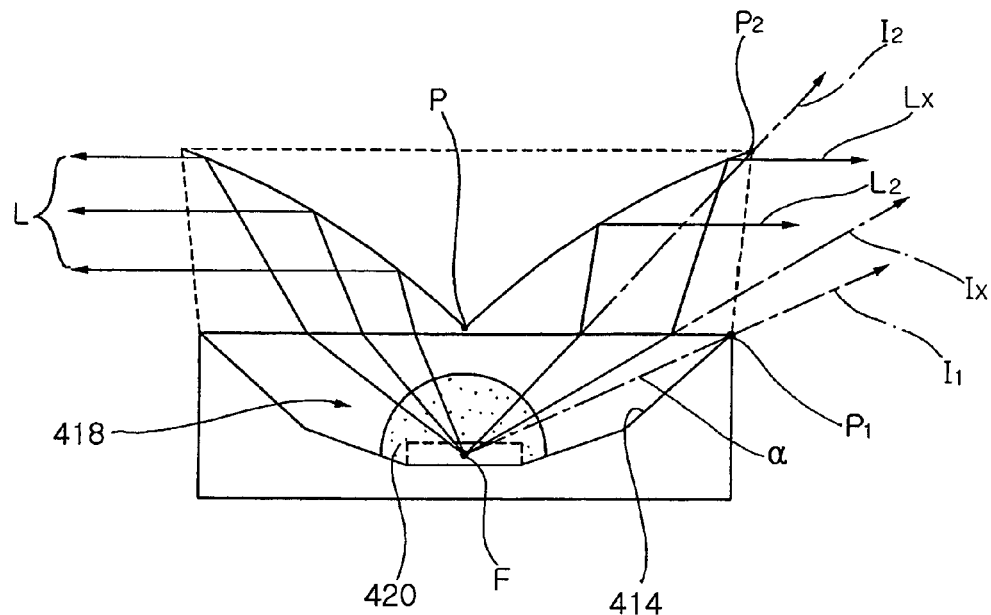
FIG. 11 is a schematic, cross-sectional view illustrating an operation of the LED package of FIG. 10.

FIG. 10 is a cross-sectional view of an LED package according to the fourth embodiment of the present invention and FIG. 11 is a schematic, cross-sectional view illustrating an operation of the LED package of FIG. 10.

Referring to FIG. 10, an LED package 400 of the fourth embodiment is the same as the LED package 300 of the third embodiment except that a sealing member 420 formed around an LED chip 402 inside a concaved cavity C is of a hemisphere shape having a predetermined radius r, part of the cavity C is maintained vacant, and a bottom of the upper structure 430 is combined to an upper edge of a lower structure 410. Therefore, the same reference numerals starting with 400 are given to the corresponding elements and descriptions thereof are omitted.

The sealing member 420 can be formed in a variety of shapes including a hemisphere, a dome, an ellipse, a frustum such as a truncated dome and a structure in which the cavity C of the lower structure 410 is filled only around the LED chip 402. Here, the hemispheric shape or a hemisphere type includes various shapes.

The sealing member 420 is a transparent resin. For the sealing member, material having thixotropy and that can maintain a constant shape when discharged is selected. For such material, JCR6101up which is a product name of Dow Corning may be used.

Further, for an apparatus for precisely discharging the resin into the cavity C, ML-808FX, which is a product name of Musashi can be used. This apparatus can perform a dotting control up to approximately 0.03 cc.

Operation of the LED package 400 of the fourth embodiment of the present invention will be described with reference to FIG. 11.

Referring to FIG. 11, an optical path $I_1$ represents light propagating from the focus F of the LED chip to a connection point P1 at an edge of the lower mirror 414, an optical path $I_2$ represents light propagating from the focus F of the LED chip to a connection point P2 between the reflecting surface 434 and the discharging surface 436. In case of the LED package 300 of the third embodiment, light between the optical paths $I_1$ and $I_2$ is all directly discharged through the discharging surface 436 without passing through the reflecting surface 434.

However, since the sealing member 420 is of a hemisphere shape and a vacant space is formed in a cavity C between the sealing member 420 and the bottom 438 of the upper structure 430 according to the fourth embodiment, light $L_1$ and $L_x$ generated from the focus F propagates straight when coming from the sealing member 420 but is refracted toward the reflecting surface 434 by a difference in the refractive indexes between air and the resin when the light is incident from the cavity C to the bottom 438 of the upper structure. The refracted light is reflected by the reflecting surface 434 and discharged in a lateral direction through the discharging surface 436. As a result, it is possible to reduce a view angle of light discharged to the lateral direction in the LED package 400. The overall light path is denoted by L and α is an angle between the optical paths $I_1$ and $I_2$.

Figure 12:
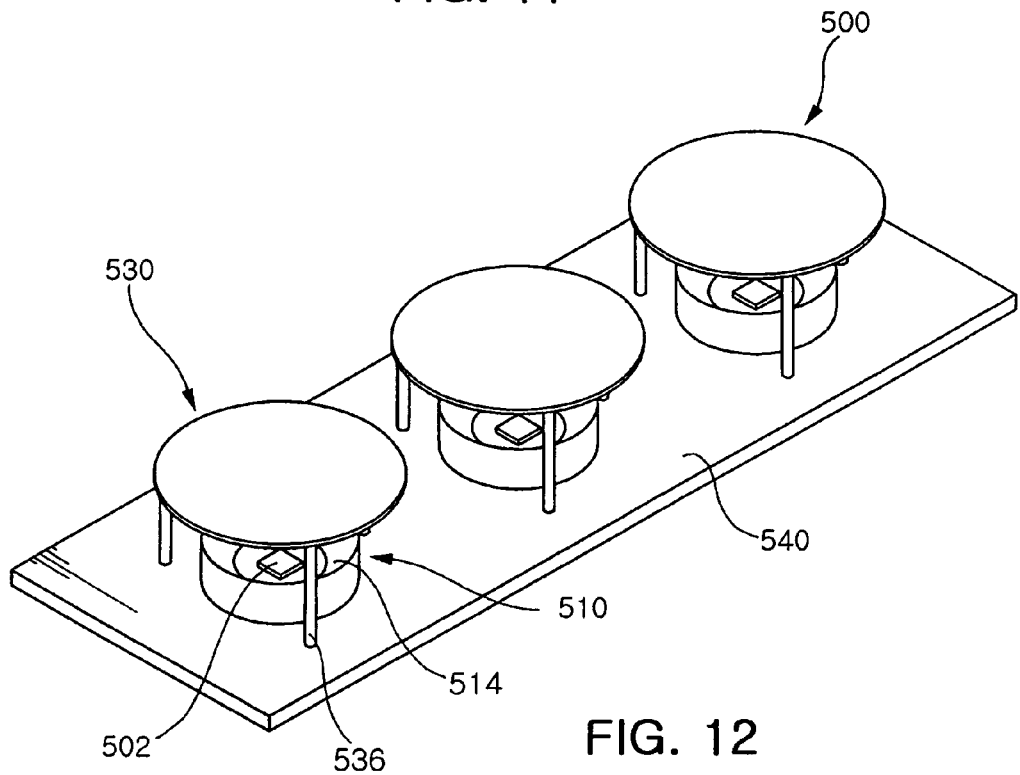
FIG. 12 is a perspective view of LED assemblies according a fifth embodiment of the invention.
Figure 13:
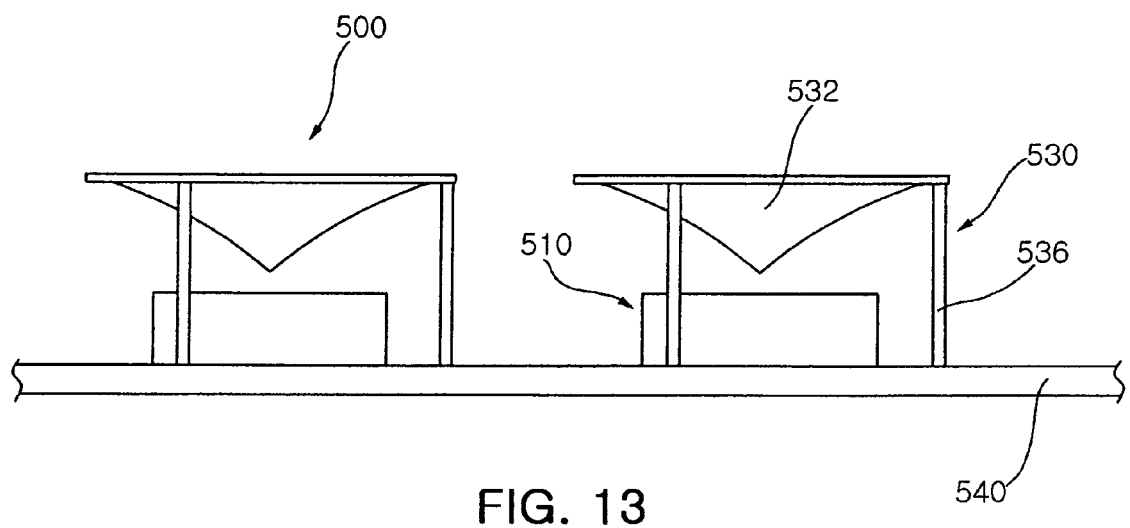
FIG. 13 is a front elevational view of the LED assemblies shown in FIG. 12.
Figure 14:
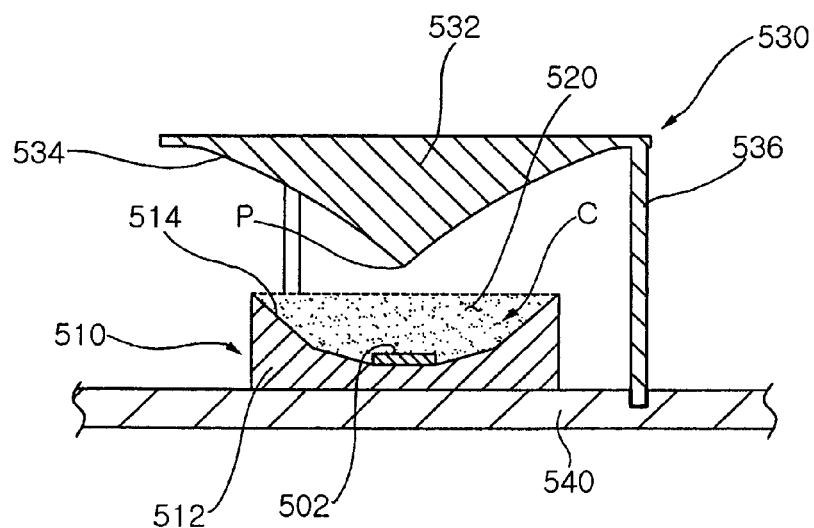
FIG. 14 is a cross-sectional view of one of the LED assemblies shown in FIG. 12.

FIG. 12 is a perspective view of LED assembly according to a fifth embodiment of the invention, FIG. 13 is a front elevational view of the LED assembly shown in FIG. 12, and FIG. 14 is a cross-sectional view of the LED assembly shown in FIG. 12.

Referring to FIGS. 12 to 14, an LED assembly 500 of this embodiment is arranged on a substrate, which is preferably a reflector plate inside a backlight unit (not shown). Each LED assembly 500 part includes an LED chip 502, a lower structure 510 seated on the board 540 and an upper structure 530, and arranged at a predetermined interval from adjacent assembly parts. The lower structure 510 is designed to seat the LED chip 502 thereon while reflecting light upward from the LED chip 502, and the upper structure 530 is designed to reflect light from the lower structure substantially radially in a lateral direction.

The lower structure 510 has a body 512 housing the LED chip 502, and a central portion of the body 512 is concaved downward forming a cavity C. The cavity C has a flat bottom functioning as a mount supporting the LED chip 502, and the wall of the cavity C surrounding the LED chip 502 forms a lower mirror 514 that reflects light upward from the LED chip 502. A transparent sealing member 520 is filled into the cavity 520 to seal the LED chip 502 from outside.

Figure 15:
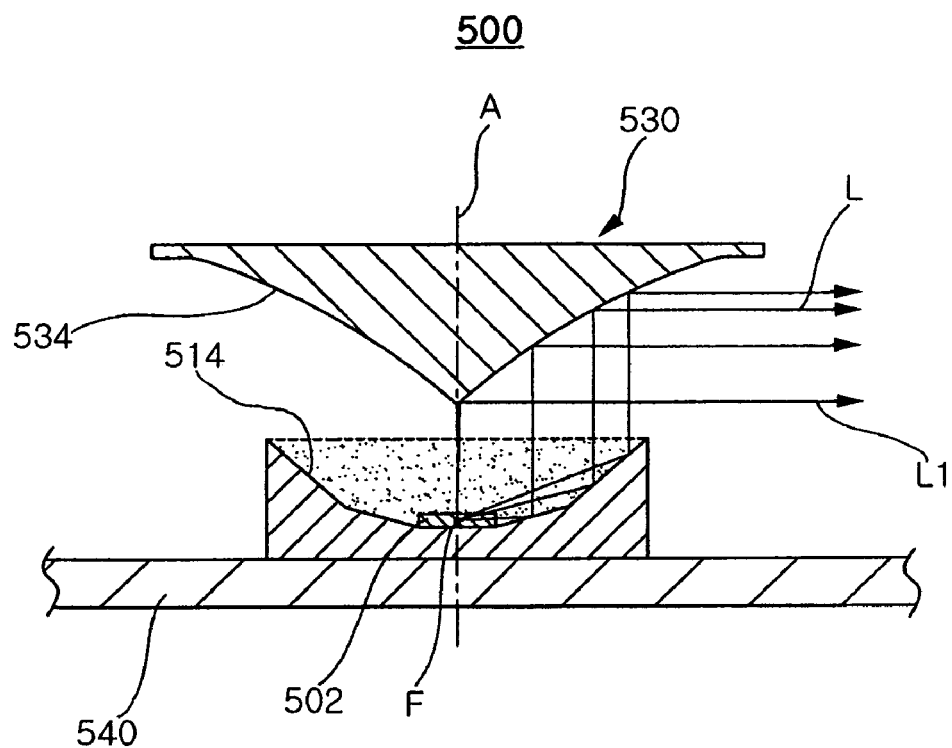
FIG. 15 is a cross-sectional view schematically illustrating the operation of the LED assembly shown in FIG. 12.

The lower mirror 514 is extended upward and outward from the LED chip 502 so as to reflect light L upward from the LED chip 502 as shown in FIG. 15. The lower mirror 514 is defined by a plurality of planes connected together as shown in the drawing. Alternatively, the lower mirror may be defined by a single or plural curved surfaces designed to reflect light L upward from the LED chip 502 to the upper structure 530.

The lower structure body 512 may be formed through for example casting, cutting and molding, and made from metal or polymer integral with the lower mirror 514. In this case, the lower structure body 512 and/or the lower mirror 514 are made of high reflectivity metal or polymer. Examples of such high reflectivity polymer are of as described above in the first embodiment.

Alternatively, the lower structure body 512 may be made of low reflectivity metal or polymer, with the lower mirror 514 being provided as a film of high reflectivity material.

The transparent sealing member 520 is made of resin, and preferably selected to have heat expansion coefficient and reflectivity similar to the LED chip 502. Particularly, silicone not only has excellent optical characteristic due to large refractive index and excellent resistance against yellowing, that is, change in quality caused by single wavelength light but also maintains jell or elastomer state even after hardening, and thus can stably protect the LED chip 102 from impulses and vibrations.

The upper structure 530 is of a tripod shape on the whole, symmetric about the axis A. The upper structure 530 includes a funnel-shaped main body 532 and three pins 536 joined to the board 540 to support the upper structure 530. Further, the main body 532 has an upper mirror 534 on its lower surface.

The upper mirror 534 can have a variety of shapes such as a conical shape and a somewhat swollen conical shape besides the funnel shape as shown.

The upper mirror 534 is configured to reflect light L, which is generated from the LED chip 502 and reflected upward by the lower mirror 514, in a lateral direction. In addition, the upper mirror 534 reflects light L1, which is directly incident on the upper portion from the LED chip 502, in a lateral direction.

In the meantime, the upper mirror 534 is arranged so that its axial line A that includes a vertex P may be aligned with a focus F of the LED chip 502. Here, the focus F means a point positioned at a center of the LED chip 502, which is a light-emitting source.

At this point, the main body 532 of the upper structure 530 can be formed using casing, cutting, and molding, and can be manufactured integrally with the upper mirror 534 using metal or polymer. In that case, the main body 532 and the upper mirror 534 of the lower structure 510 are formed using metal of a high reflectivity or polymer of a high reflectivity.

Unlike this configuration, the main body 532 of the upper structure can be made of metal or polymer of a low reflectivity and the upper mirror 534 can be prepared in form of a film of a high reflectivity. This film can be realized using metal of a high reflectivity or the above-described polymer of a high reflectivity. Further, for injection material having an excellent reflectivity, there exists material containing $TiO_2$.

The pins 536 are adhered to or inserted into the sealing member 520 to combine the upper structure 530 to the lower structure 510, and have such a diameter that does not have an influence on the light L reflected to the lateral direction by the upper mirror 534, preferably a diameter of less than 0.4 mm.

Reference will now be given to FIGS. 16 to 19 in order to explain examples of the pin 536 of the upper structure 530 fixed to the board 540.

Figure 16:
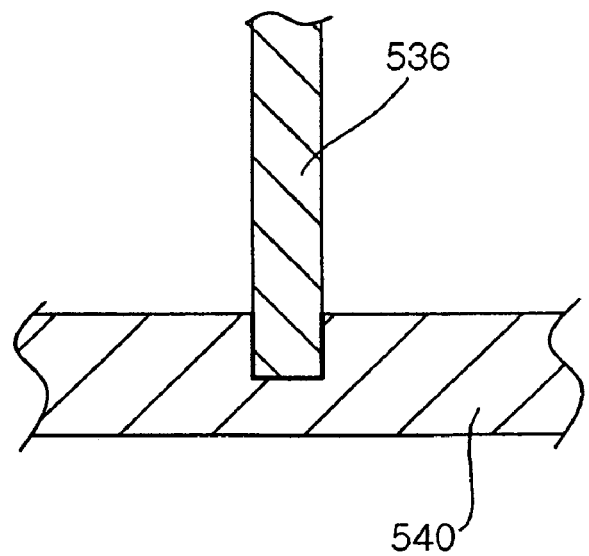
FIGS. 16 to 19 are cross-sectional views showing a pin and a board of the LED assembly, engaged into each other in various shapes.

First, as shown in FIG. 16, the board 540 is provided with a groove (or hole) of a diameter corresponding to that of the pin 536, which is in turn fixedly inserted into the groove. Of course, the groove diameter may be finely smaller than that of the pin 536 to enable interference fit.

Figure 17:
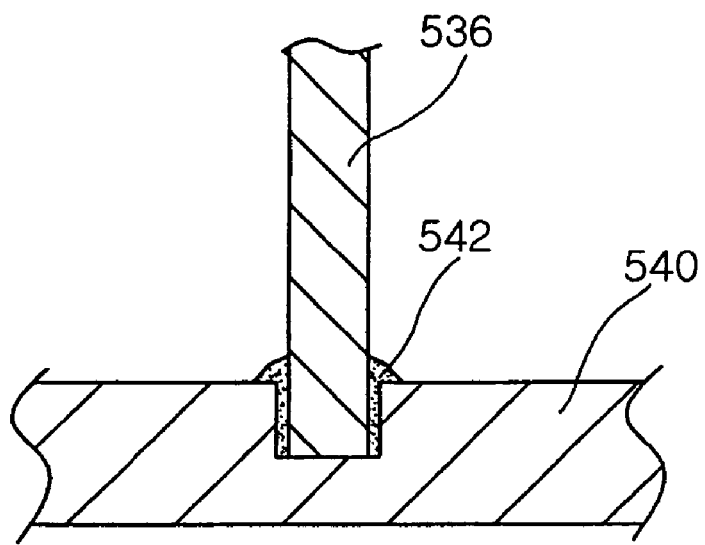

FIG. 17 shows an example using adhesive. That is, the pin 536 may be more securely fixed to the board 540 when the pin 536 is inserted into the groove of the board 540 filled with adhesive 542. Of course the groove diameter may be finely larger than that of the pin 536.

Figure 18:
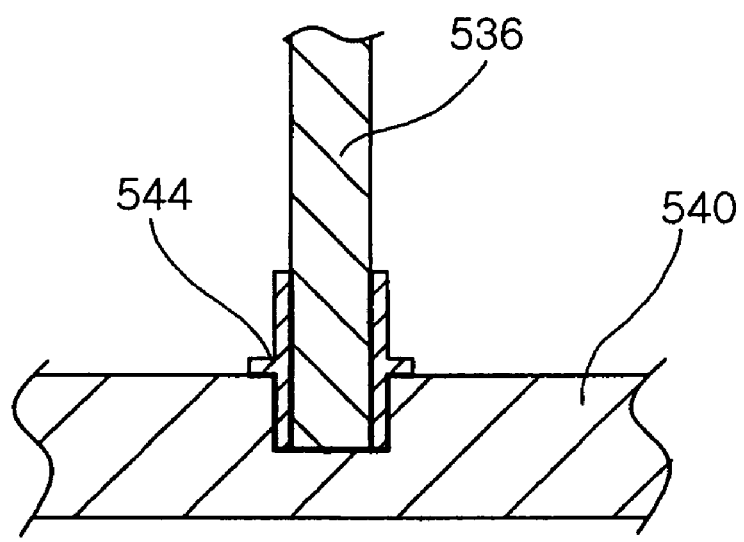

FIG. 18 shows an example using a holder 544 to fix the pin 536 to the board 540, in which the holder 544 is inserted into the groove of the board 540. Of course, the board 540 may be provided with a hole in which the holder 544 is installed.

Figure 19:
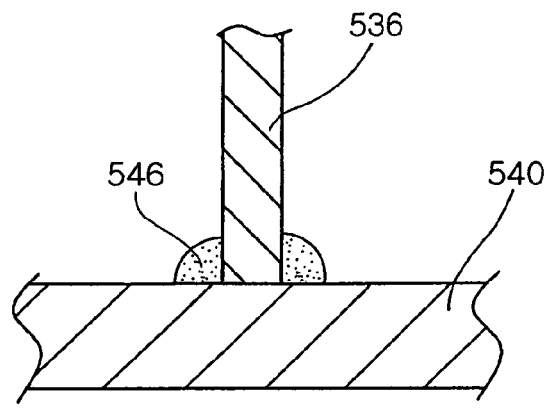

FIG. 19 shows an example fixing the pin 536 to the board 540 by weld 546.

As described above, the pin 536 can be fixed to the board 540 according to various methods.

Figure 20:
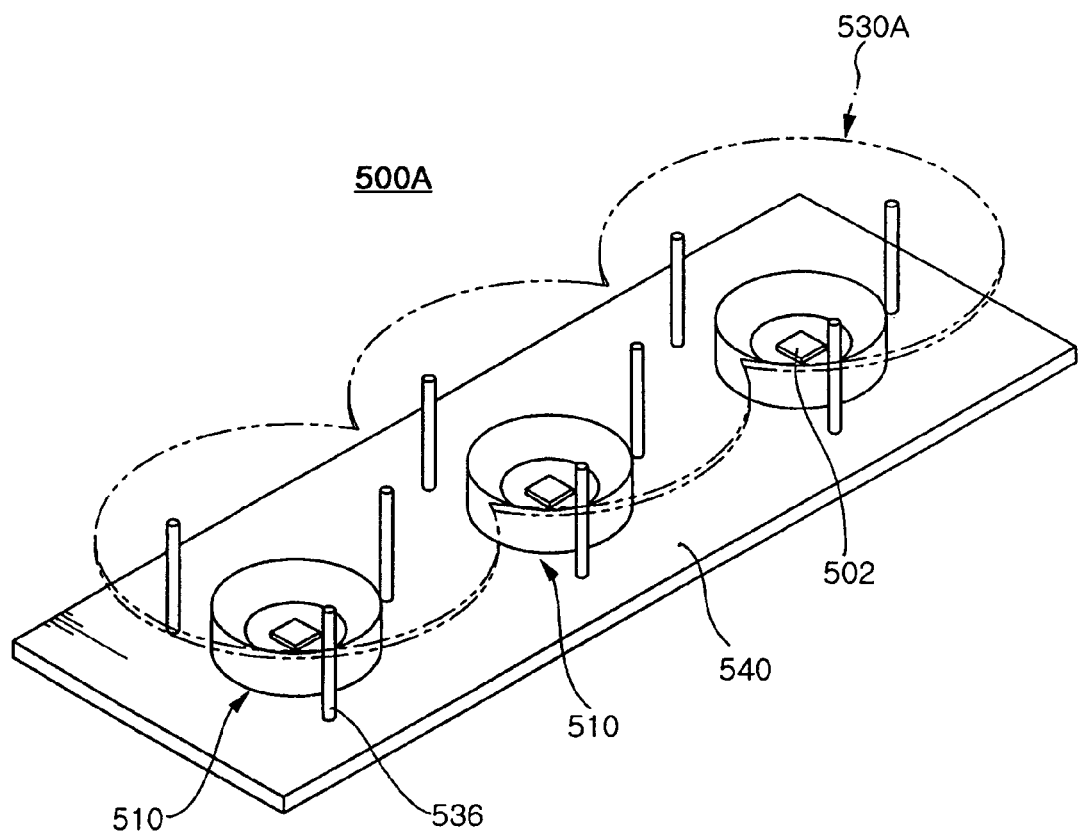
FIG. 20 is a perspective view of an alternative to the LED assembly according to the fifth embodiment.

FIG. 20 is a perspective view of an alternative to the LED assembly shown in FIG. 12.

The LED assembly 500A includes a single upper structure 530A arranged above several lower structures 510. This structure may be available when the lower structures 510 are arranged adjacent from each other.

Figure 21:
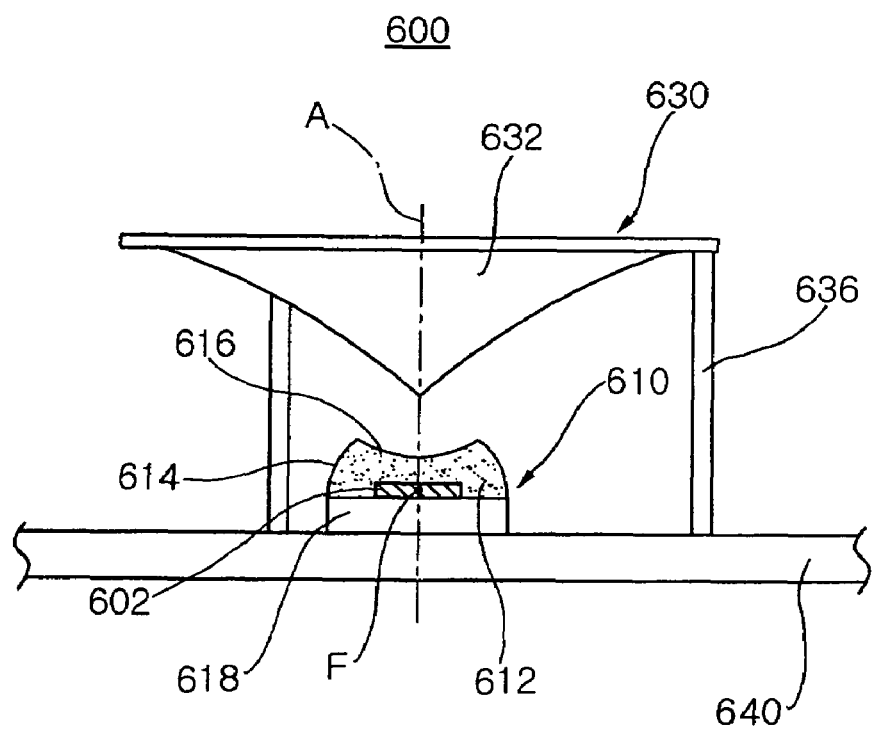
FIG. 21 is a front elevational view of an LED assembly according to a sixth embodiment of the invention.
Figure 22:
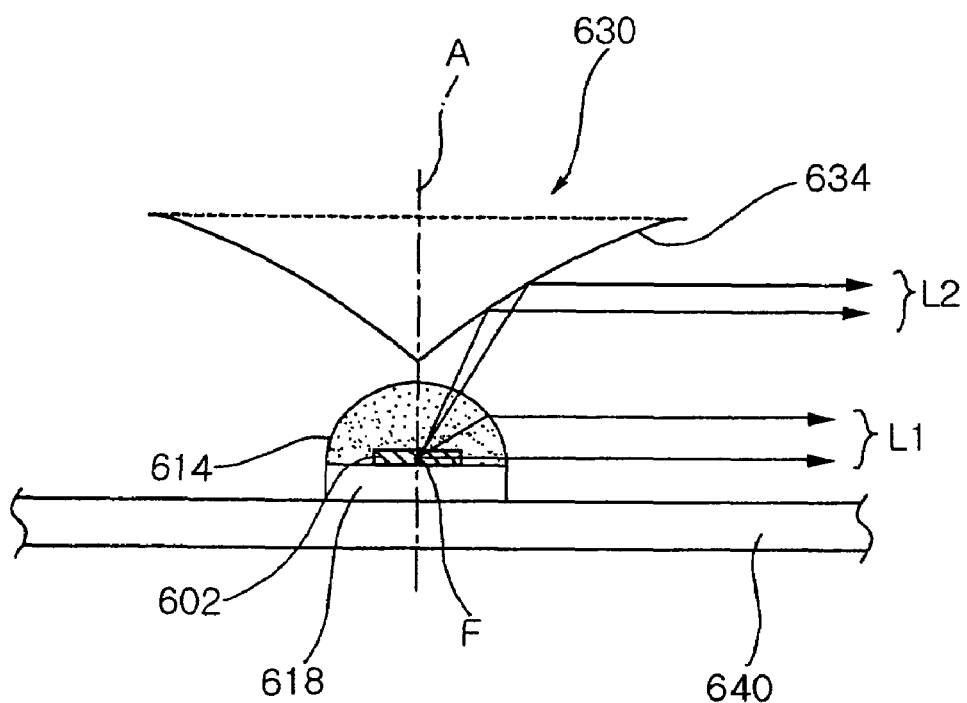
FIG. 22 is a cross-sectional view schematically illustrating the operation of the LED assembly shown in FIG. 21.

FIG. 21 is a front elevational view of an LED assembly according to a sixth embodiment of the invention, and FIG. 22 is a cross-sectional view schematically illustrating the operation of the LED assembly shown in FIG. 21. An LED assembly 600 of this embodiment includes a plurality of assembly part as shown in FIGS. 21 to 22, which are arranged at a predetermined interval on a board 640 that is preferably a reflector inside a backlight unit (not shown). Each LED assembly 600 part includes an LED chip 602, a lower structure 610 seated on the board 640 and an upper structure 530. The lower structure 510 is designed to seat the LED chip 602 thereon while reflecting light upward from the LED chip 502, and the upper structure 530 is designed to reflect light from the lower structure radially in a lateral direction.

The lower structure 610 includes a sealing part 612 sealing the LED chip 602 and a mount 618 supporting the LED chip 602 as a base. The sealing part 612 is made of transparent resin such as epoxy and silicone, and the sealing part 612 has an upper hemispherical radiating surface 614 extended up from the mount 618. The mount 618 has terminals that power the LED chip 602 and a heat conducting part (or heat slug) that dissipates heat generated to outside. The mount 618 may be made of high reflectivity metal or polymer to form a reflector or mirror surface that reflects light upward from the LED chip 602. Alternatively, such material may be coated or printed on the mount 618 to form the mirror surface.

The upper structure 630 and the board 640 are substantially the same as the upper structure 530 and the board 640 of the fifth embodiment, and thus their explanation will be omitted.

Referring to FIG. 22, light $L_1$ generated from the focus F of the LED chip 602 exits to outside through the radiating surface 614, refracted in a lateral direction owing to the refractivity difference between the sealing part 612 and the air and the curvature of the radiating surface 614. Light $L_2$ emitted upward from the radiating surface 614 are also reflected in a lateral direction by a mirror surface 634 of the upper structure 630. This makes light $L_1$, $L_2$ generated from the LED chip 602 exit along a direction parallel to the plane on which the LED chip 602 is mounted.

While light $L_2$ emitted upward from the radiating surface 614 is shown as not refracting on the radiating surface, it may be refracted toward the axis A or in a lateral direction according to the curvature of the radiating surface 614 and so on. In addition to the hemispheric configuration, the sealing part 612 may have various shapes such as dome, truncated upper hemisphere or dome, upper hemisphere or dome with a concaved upper surface and so on.

Figure 23:
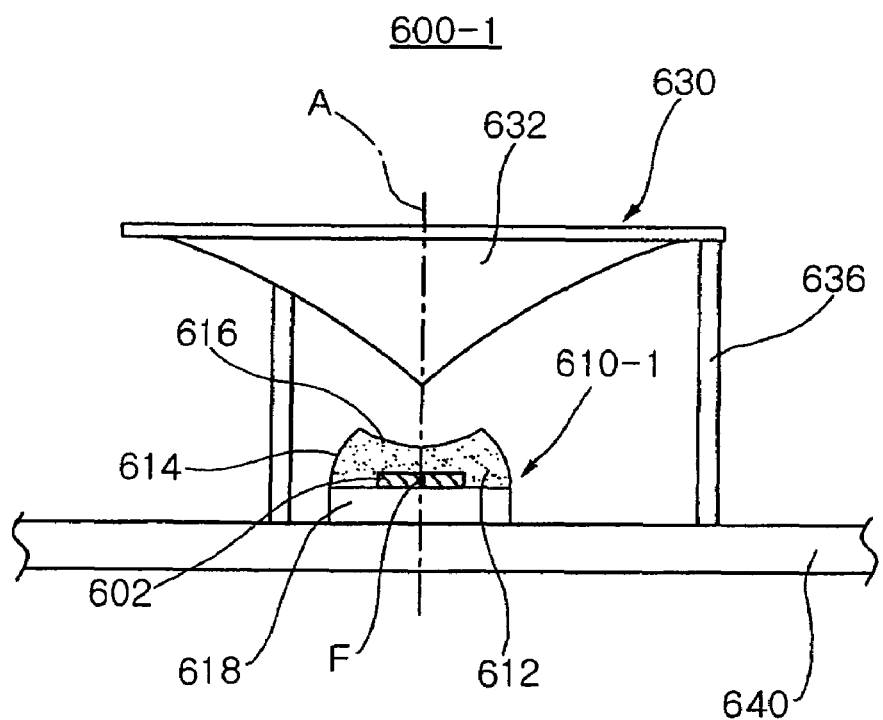
FIG. 23 is a front elevational view of an alternative to the LED assembly according to the sixth embodiment of the invention.
Figure 24:
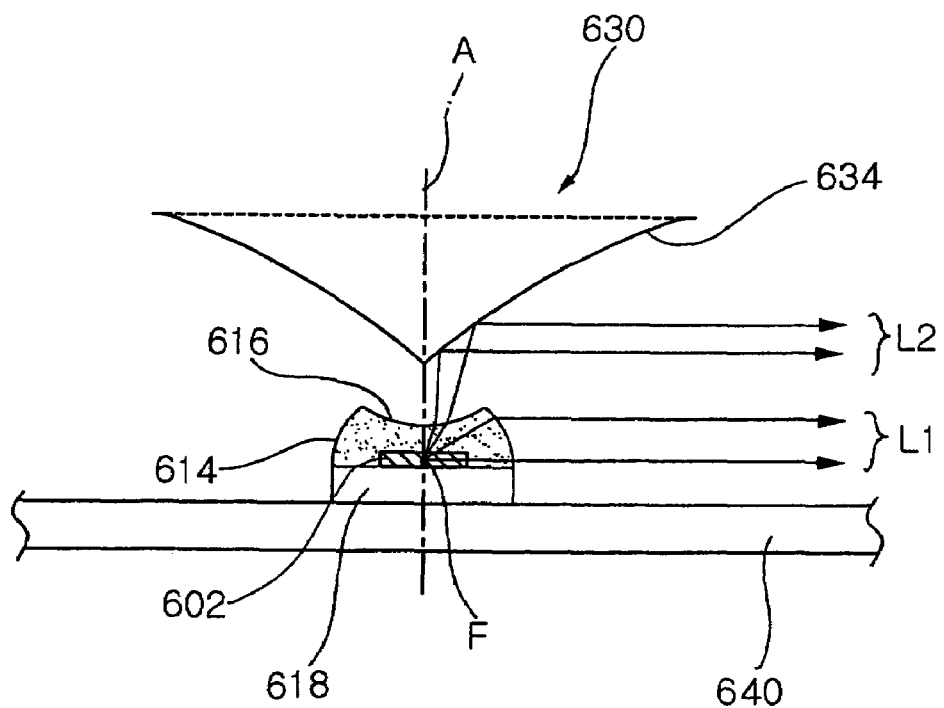
FIG. 24 is a cross-sectional view schematically illustrating the operation of the LED assembly shown in FIG. 24.

Such an alternative will be described with reference to FIGS. 23 and 24, in which FIG. 23 is a front elevational view of an alternative to the LED assembly according to the sixth embodiment of the invention, and FIG. 24 is a cross-sectional view schematically illustrating the operation of the LED assembly shown in FIG. 24.

An LED assembly 600-1 shown in FIGS. 23 and 24 is substantially the same as the foregoing LED assembly 600 except that a sealing part 612 has a first radiating surface 614 extended upward in the form of an upper hemisphere from a mount 612 and a second radiating surface 616 concaved from the top of the first radiating surface 614. So, the same reference signs are used to designate the similar components without description of the similar components.

Referring to FIG. 24, light $L_1$ and $L_2$ emitted from the focus F of an LED chip 602 exits to outside through the first and second radiating surfaces 614 and 616. Light $L_1$ is refracted in a lateral direction owing to the refractivity difference between the sealing part 612 and the air and the curvature of the first radiating surface 614. Light $L_2$ is refracted toward the central axis A owing to the refractivity difference between the sealing part 612 and the air and the curvature of the second radiating surface 616, and then in a lateral direction by a reflecting surface 634 of an upper structure 634. This as a result makes light $L_1$ and $L_2$ generated by the LED chip radiate in a direction substantially perpendicular to the central axis A, that is, substantially parallel to the plane on which the LED chip 602 is mounted.

If the sealing part 612 is shaped as a truncated upper hemisphere or dome, light path will intermediate between those as shown in FIGS. 22 and 24. However, the light path may be varied according to the overall configuration and refractivity of the sealing part 612.

Figure 25:
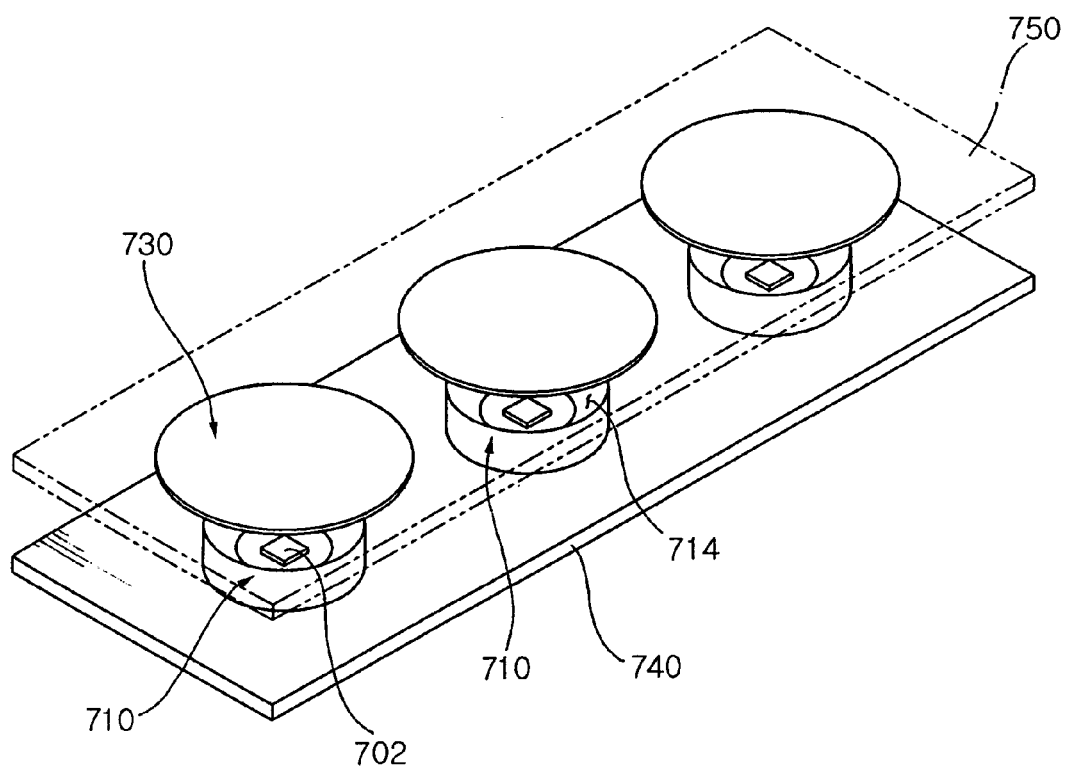
FIG. 25 is a perspective view of an LED assembly according to a seventh embodiment of the invention.
Figure 26:
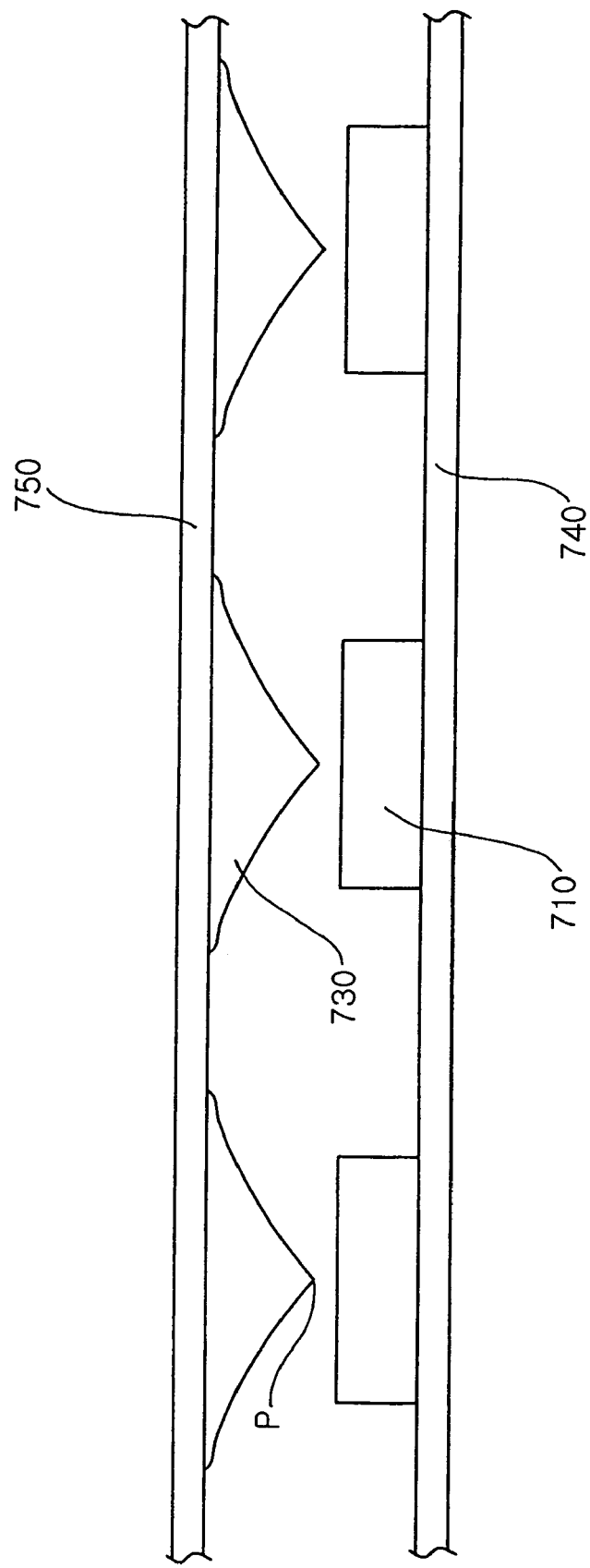
FIG. 26 is a front elevational view of the LED assembly shown in FIG. 25.
Figure 27:
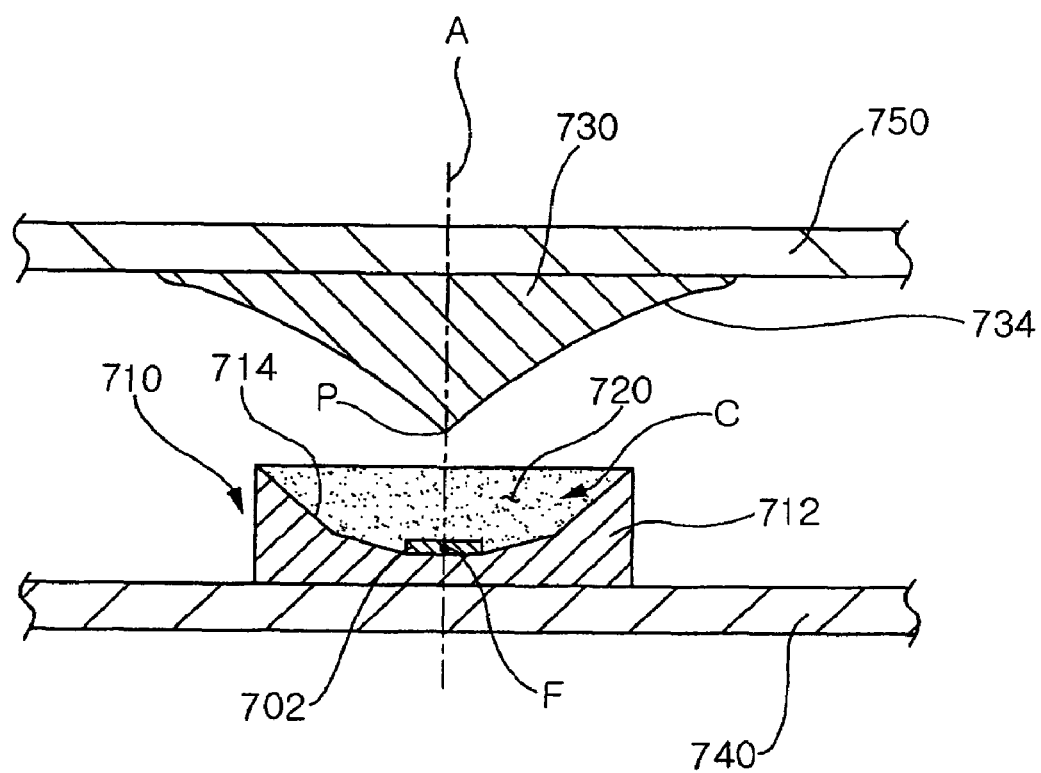
FIG. 27 is a cross-sectional view schematically illustrating the operation of the LED assembly shown in FIG. 25.

FIG. 25 is a perspective view of an LED assembly according to a seventh embodiment of the invention, FIG. 26 is a front elevational view of the LED assembly shown in FIG. 25, and FIG. 27 is a cross-sectional view schematically illustrating the operation of the LED assembly shown in FIG. 25.

Referring FIGS. 25 to 27, an LED assembly 700 is arranged preferably inside a backlight unit (not shown). The LED assembly 700 includes LED chips 702, lower structures 710 sealing the LED chip 702, a board 740 seating the lower structure 710, a transparent plate 750 arranged above the board 740 at a predetermined distance from the lower structure 710 and upper structures 730 attached to the bottom of the transparent plate 750. Each of the lower structures 712 is configured to radiate light upward from the LED chip 702, and each of the upper structures 730 is configured to reflect light, which is radiated upward by the lower structure 710, radially in a lateral direction.

The lower structure 710 is substantially the same in configuration and function as those of the lower structure 510 of the fifth embodiment. So, the same reference signs are used to designate the similar components without description thereof.

The upper structure 730 is of a funnel-shaped body symmetric about the central axis, arranged from the lower structure 710 at a predetermined distance. The upper structure 730 is attached by its top surface to the bottom of the transparent plate 750. In addition to the funnel-like configuration as shown, the upper plate 730 may have various configurations such as a cone, a rather convexed cone and the like.

The upper structure 730 is made of metal or high reflectivity molding, and may be preferably attached to the bottom of the transparent plate 750. Alternatively, the transparent plate 730 may be prepared first, and then the upper structure 730 may be formed on the bottom of the transparent plate 730 by injection molding.

An upper mirror 734 is configured to reflect light, which is generated by the LED chip 702 and reflected upward by the lower mirror 714, again in a lateral direction. The upper mirror 734 also reflects light, which is incident on the upper mirror 734 directly from the LED chip 702, in a lateral direction. The construction and operation of the lower and upper mirrors 714 and 734 are substantially the same as those of the fifth embodiment as described above, and thus will not be described again.

In this embodiment, the board 740 is preferably a reflector plate of a backlight unit, and the transparent plate 750 is preferably a transparent plate or light guide plate of the backlight unit. This means that the LED assembly 700 of this embodiment is realized as a single unit inside the backlight unit.

The lower structure 710 of this embodiment may also be configured the same as the lower structures 610 and 610-1 of the sixth embodiment and its alternative.

While the upper structures 730 and the lower structures 710 are illustrated in the same number, it is also possible to provide a single upper structure that reflects light laterally, which is reflected upward by a plurality of lower structures 710, as illustrated in the fifth embodiment in FIG. 20.

According to the present invention, the lower structure for reflecting the light form the LED chip upward and the upper structure for reflecting this light to the lateral direction are separately provided and combined with each other, whereby molding efficiency of the sealing member is improved and the side-emission type LED package can be manufactured in an easy manner.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An Light Emitting Diode (LED) assembly, comprising:
   multiple LED chips;
   multiple lower structures each lower structure sealing one of the multiple LED chips and configured to guide light upward from the LED chip;
   a single substrate supporting multiple said lower structures from below;
   a single transparent plate arranged above the substrate, and spaced upwardly from multiple said lower structures; and
   multiple upper structures arranged on the underside of the transparent plate and each upper structure spaced upwardly from one of multiple said lower structures by an air layer to reflect light guided upward by the respective lower structure, radially outwardly in lateral direction.

2. The LED assembly according to claim 1, wherein each upper structure has
   a reflecting surface inclined about a central axis of one LED chip to reflect light, which is reflected by one of the lower structures, radially outwardly, and
   a flat top surface attached to the underside of the transparent plate.

3. The LED assembly according to claim 2, wherein each upper structure is adhered to the underside of the transparent plate.

4. The LED assembly according to claim 2, wherein each upper structure is injection-molded on the underside of the transparent plate.

5. The LED assembly according to claim 2, wherein each upper structure is made of high reflectivity molding or metal.

6. The LED assembly according to claim 1, wherein each lower structure comprises:
   a lower mirror supporting one LED chip, the lower mirror extending upward from and around the LED chip to reflect light upward from the LED chip; and
   a transparent sealing part surrounding the LED chip inside a cavity defined by the lower mirror.

7. The LED assembly according to claim 1, wherein each lower structure comprises:
   a mount supporting one LED chip; and
   a transparent sealing part disposed on the mount to seal the LED chip, said transparent sealing part being completely located below one of the upper structures and spaced downwardly from the one upper structure by a unfilled space.

8. The LED assembly according to claim 1, wherein the substrate is a reflector plate of a backlight unit in which the LED assembly is installed.

* * * * *